US007385459B2

(12) United States Patent
Duan et al.

(10) Patent No.: US 7,385,459 B2
(45) Date of Patent: Jun. 10, 2008

(54) BROADBAND DC BLOCK IMPEDANCE MATCHING NETWORK

(75) Inventors: Dahweih Duan, Torrance, CA (US); Alex Chau, Rancho Palos Verdes, CA (US); Barry Allen, deceased, late of Rancho Palos Verdes CA (US); by Janice Allen, legal representative, Rancho Palos Verdes, CA (US); David Brunone, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 341 days.

(21) Appl. No.: 11/222,254

(22) Filed: Sep. 8, 2005

(65) Prior Publication Data

US 2007/0052492 A1 Mar. 8, 2007

(51) Int. Cl.
*H03H 7/38* (2006.01)

(52) U.S. Cl. .......................... 333/33; 333/32; 333/246

(58) Field of Classification Search ................ 333/238, 333/246, 32, 33
See application file for complete search history.

(56) References Cited

U.S. PATENT DOCUMENTS

| | | | | |
|---|---|---|---|---|
| 3,573,670 | A * | 4/1971 | Skobern | 333/33 |
| 5,093,640 | A * | 3/1992 | Bischof | 333/33 |
| 2002/0105395 | A1 | 8/2002 | Tajima | |

FOREIGN PATENT DOCUMENTS

| | | | |
|---|---|---|---|
| JP | 60 214601 | A | 10/1985 |
| JP | 06 085511 | A | 3/1994 |

* cited by examiner

*Primary Examiner*—Stephen E Jones
(74) *Attorney, Agent, or Firm*—Patti, Hewitt & Arezina LLC

(57) ABSTRACT

An apparatus in one example has: a substrate having a microstrip line; a capacitor at a predetermined location along the microstrip line, the capacitor producing a discontinuity; and a ground plane assembly on the substrate, the ground plane assembly having an opening that compensates for the discontinuity of the capacitor.

20 Claims, 6 Drawing Sheets

BROADBAND DC BLOCK IMPEDANCE MATCHING NETWORK

TECHNICAL FIELD

The invention relates generally to broadband communication, and more particularly to matching networks for blocking capacitors in broadband communication networks.

BACKGROUND

Wideband (high-speed) data transfer at rates in excess of 40 Gigabits-per-second (Mbps) is expensive for dedicated bandwidth (e.g., leased lines) over the existing telecommunications infrastructure. Over modest ranges where an unobstructed line of sight exists, a laser communication link can provide an alternative means of obtaining dedicated bandwidth at high data rates.

For this and other reasons, wireless information transmission systems in general are increasingly desirable as alternatives to costly wired installations and high telecommunications rates which prevail even for short distance communications. Radio frequency communications systems have the disadvantage of requiring that carrier frequency and communications bandwidth be assigned to an application, since the much wider beamwidths and sidelobes can interfere with each other. Thus, there is an increasing need for communications systems, such as those using light frequencies, that transmit large quantities of information in a line-of-sight application without creating interference problems.

DC blocking capacitors are used in a wide variety of applications, such as in the fields of RF (radio frequency), wireless communications, high speed electronic circuits, and traditional amplifier circuits. Each of these different fields require decoupling of different circuit sections.

In one example, laser communication transmit and receive modules require broadband DC blocking capacitors. These DC blocking capacitors have to work over multi-octave bandwidths. Current manufactures produce the broad bandwidth capacitors by attaching a 0.1 uf chip cap to an 82 pf parallel plate cap. However, due to flight requirements (for example, requirements in the space industry) for plate spacing in the chip caps, their physical size often exceeds a 50 ohm line width of a substrate they are being mounted on. This creates a discontinuity on the 50 ohm line. This discontinuity limits bandwidth, causes group delay, and generates the need for matching circuitry.

SUMMARY

One implementation encompasses an apparatus. The apparatus may comprise: a substrate having a microstrip line; a capacitor at a predetermined location along the microstrip line, the capacitor producing a discontinuity; and a ground plane assembly on the substrate, the ground plane assembly having an opening that compensates for the discontinuity of the capacitor.

Another implementation encompasses an apparatus. The apparatus may comprise: a substrate having top and bottom surfaces; a microstrip line on the top surface of the substrate; a capacitor at a predetermined location along the microstrip line, the capacitor having first and second plates located substantially on the top surface of the substrate and that define a capacitor plate area; a ground plane on the bottom surface of the substrate, the ground plane having a cutout area that forms a window in the ground plane; a ground sheet adjacent the bottom surface of the substrate, the ground sheet having a cutout section; and the window in the ground plane being aligned substantially below the first and second plate area of the capacitor, and the cutout section of the ground sheet being aligned substantially below the window in the ground plane.

Another implementation encompasses a method. This embodiment of the method may comprise: forming a substrate having top and bottom surfaces; forming a microstrip line on the top surface of the substrate; forming a blocking capacitor at a predetermined location along the microstrip line, the blocking capacitor having first and second plates located substantially on the top surface of the substrate and that define a capacitor plate area; forming a ground plane on the bottom surface of the substrate; cutting out an area in the ground plane to form a window in the ground plane aligned substantially below the first and second plate area of the capacitor; forming a ground sheet adjacent the bottom surface of the substrate; and cutting a section out of the ground sheet such that the cutout section is aligned substantially below the window in the ground plane.

DESCRIPTION OF THE DRAWINGS

Features of exemplary implementations of the invention will become apparent from the description, the claims, and the accompanying drawings in which:

DETAILED DESCRIPTION

Blocking capacitors are known in the art for blocking DC voltages from being coupled from one circuit element to another circuit element while allowing passage of AC signals that occur in a predetermined frequency band. When the circuit elements are coupled by microstrip lines, a problem can arise when the required size of the "plate area" of the blocking capacitor is wider than the strip-line. Such a discontinuity in the microstrip line adversely affects the passage of the AC signals. Embodiments of the present method and apparatus provide matching networks that compensate for these discontinuities without adding undue physical size to the circuitry. This is particularly important for applications in the space industry, for example.

In the prior art wideband (for example, from kilohertz to gigahertz) compensation was difficult. Solutions could provide compensation at low frequencies, but not at high frequencies resulting in bit errors in data transmission due to group delays. Embodiments of the present method and apparatus overcome these problems in the prior art.

Figure 1:
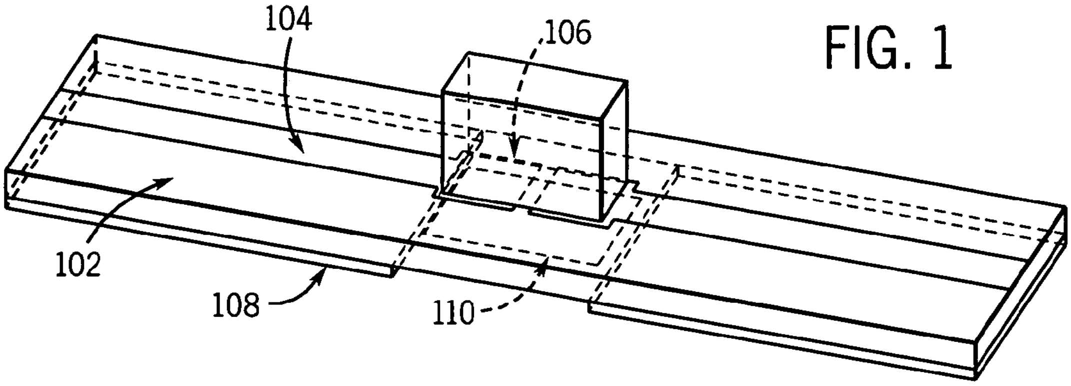
FIG. 1 shows a top perspective view of one embodiment of a microstrip line with a DC blocking capacitor and discontinuity matching network according to the present method and apparatus.

FIG. 1 shows a top perspective view of one embodiment of a microstrip line with a DC blocking capacitor and discontinuity matching network according to the present method and apparatus. In this embodiment a substrate 102 may have a microstrip line 104 and a capacitor 106 at a predetermined location along the microstrip line 104. The capacitor 106 may produce a discontinuity as is known. A ground plane assembly 108 is provided on the substrate 102, and may have an opening 110 that compensates for the discontinuity of the capacitor 106. The ground plane assembly 108 may be located substantially adjacent to the capacitor 106. An important advantage of the embodiments of the present method and apparatus is that the resulting matching network (formed at least by the ground plane assembly 108) is not effected outside of the area of the capacitor 106.

Figure 2:
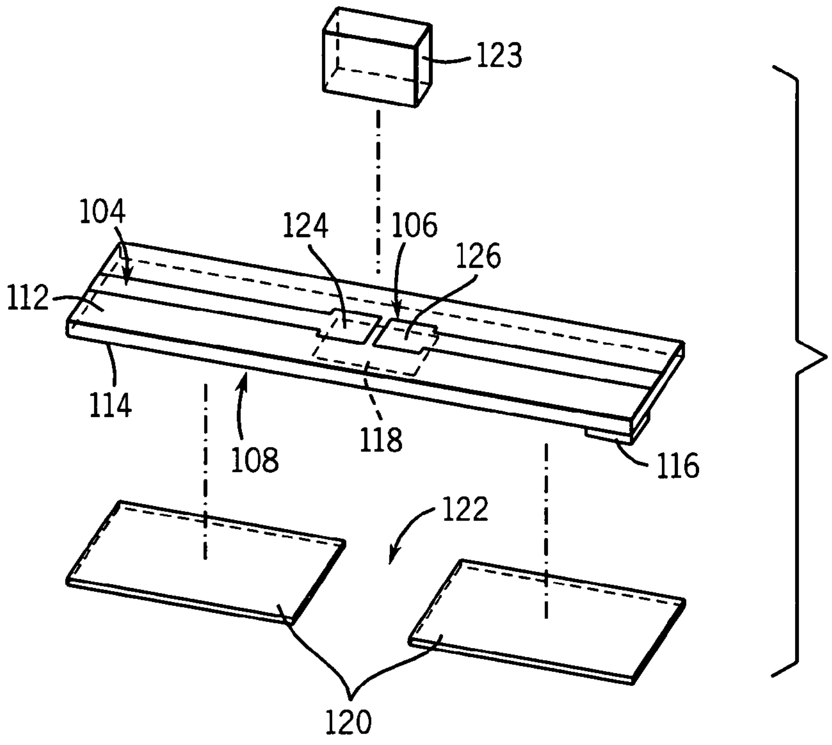
FIG. 2 shows an exploded top perspective view of one embodiment of the FIG. 1 apparatus.

FIG. 2 shows an exploded top perspective view of the embodiment of the FIG. 1 apparatus. The substrate 102 may have top and bottom surfaces 112, 114. The microstrip line 104 is located on the top surface 112 of the substrate 102, and the capacitor 106 may be at a predetermined location along the microstrip line 102 The ground plane assembly 108 may be located on the bottom surface 114 of the substrate 102. The ground plane assembly 108 may have a ground plane 116 on the bottom surface 114 of the substrate 102, and the ground plane 116 may have a cutout area that forms a window 118 in the ground plane 116. The ground plane assembly 108 may further have a ground sheet 120 adjacent the bottom surface 114 of the substrate 102, the ground sheet 120 having a cutout section 122. The window 118 in the ground plane 116 may be aligned substantially below the capacitor 106, and the cutout section 122 of the ground sheet 120 may be aligned substantially below the window 118 in the ground plane 116. The window 118 and the cutout section 122 form the opening 110 depicted in FIG. 1.

A cap 123 may be provided to cover first and second plates 126, 128 of the capacitor 106.

Figure 3:
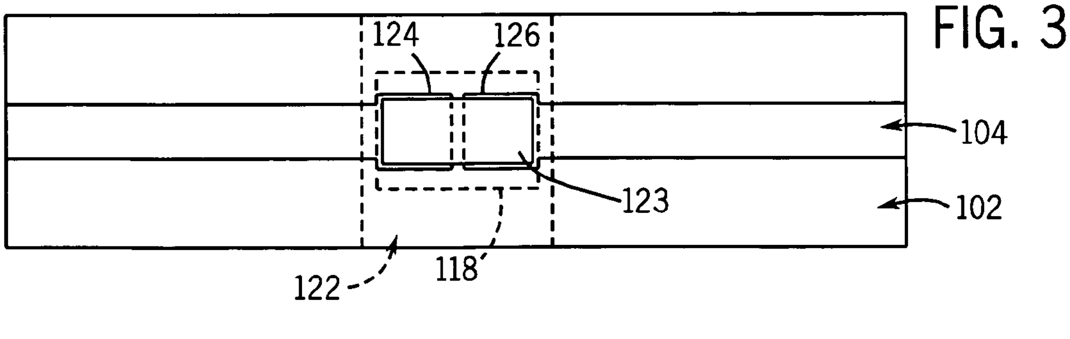
FIG. 3 shows a top view of one embodiment of the FIG. 1 apparatus.
Figure 4:
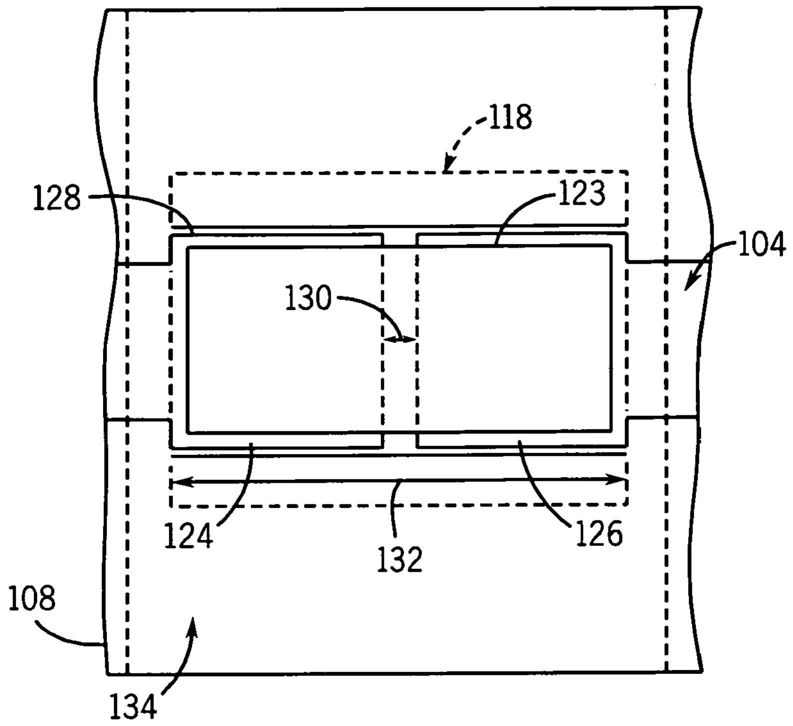
FIG. 4 shows another top view of one embodiment of the FIG. 1 apparatus.
Figure 5:
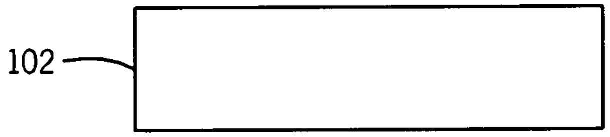
FIGS. 5, 6, 7, 8 show elements of the one embodiment of the FIG. 4 apparatus.
Figure 6:
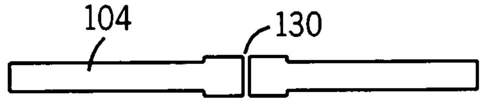
Figure 7:
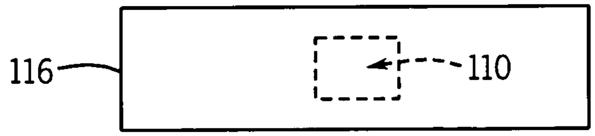
Figure 8:
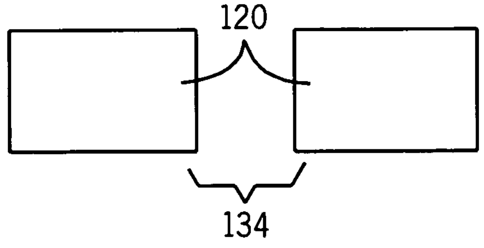

FIG. 3 shows a top view of the FIG. 1 apparatus and FIG. 4 shows another top view of the FIG. 1 apparatus. In the depicted embodiment the first and second plates 124, 126 define a capacitor plate area 128, and the first and second plates 124, 126 are spaced apart by a predetermined distance 130. The first and second plates 124, 126 and the spaced apart distance 130 define a capacitor length 132, which is substantially equal to a length of the window 118 in the ground plane 116. The cutout section 110 of the ground sheet 108 may be longer than the length 132 of the window 118 in the ground plane 116. For example, FIGS. 5, 6, 7, 8 show separately the substrate 102 (FIG. 5), the microstrip line 104 with the plates 124, 126 of the capacitor 106 (FIG. 6), the ground plane 116 with the window 118 (FIG. 7), and the ground sheet 120 with the cutout section 134 (FIG. 8).

Figure 9:
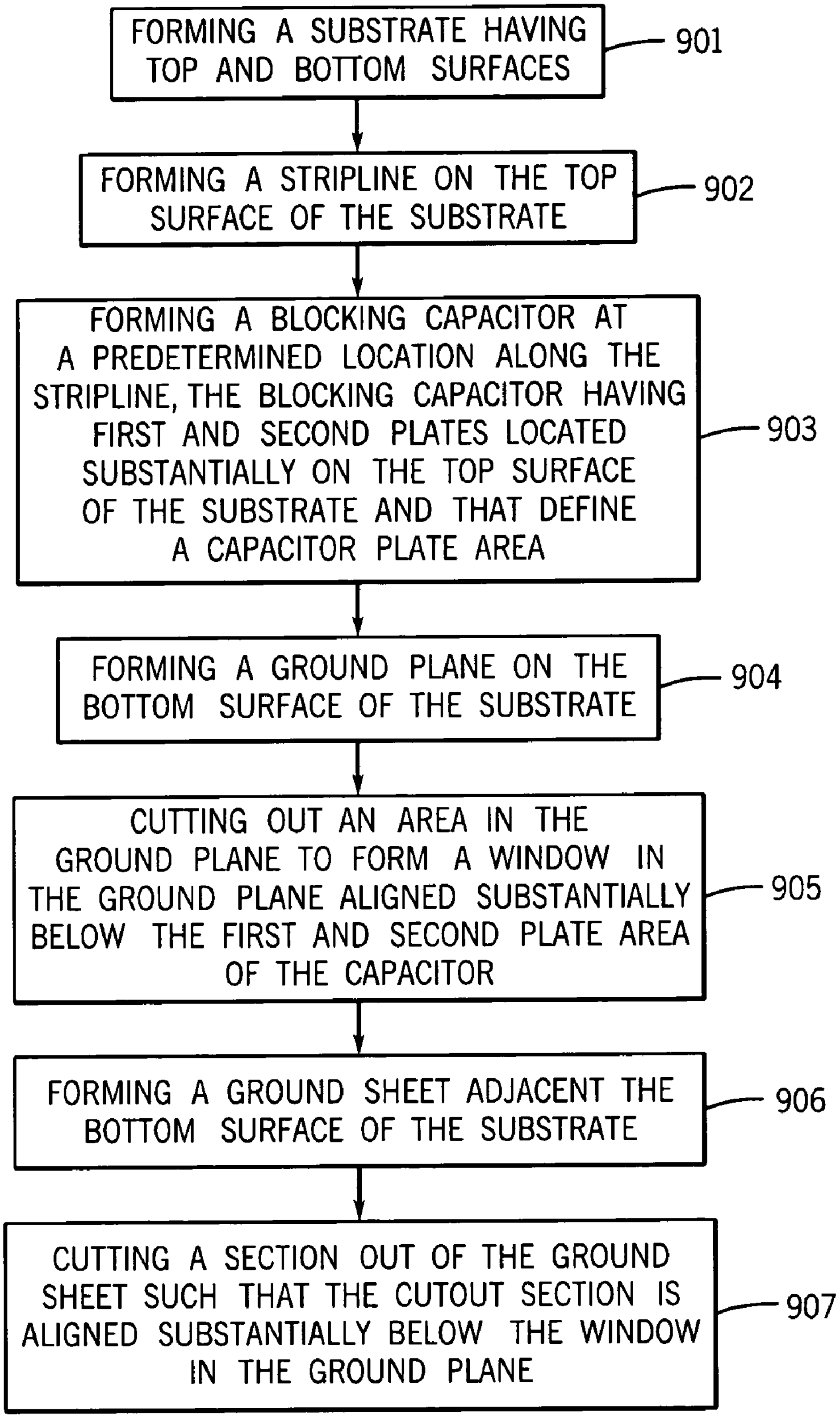
FIG. 9 is a flow diagram of a method of forming the FIG. 1 apparatus.

FIG. 9 is a flow diagram of a method of forming the FIG. 1 apparatus. In this embodiment the method may have the following steps: forming a substrate having top and bottom surfaces (901); forming a microstrip line on the top surface of the substrate (902); forming a blocking capacitor at a predetermined location along the microstrip line, the blocking capacitor having first and second plates located substantially on the top surface of the substrate and that define a capacitor plate area (903); forming a ground plane on the bottom surface of the substrate (904); cutting out an area in the ground plane to form a window in the ground plane aligned substantially below the first and second plate area of the capacitor (905); forming a ground sheet adjacent the bottom surface of the substrate (906); and cutting a section out of the ground sheet such that the cutout section is aligned substantially below the window in the ground plane (907).

One embodiment of the present method and apparatus may have the following dimensions. The substrate 102 may be a 10 mil z-cut substrate with double sided patterns, and may measure 80 mils by 300 mils. The microstrip line 104 may be 18 mil wide, and the capacitor 106 may have plates 124, 126 that measure 24 mils wide and 20 mils long with a gap 130 between the plates 124, 126 of approximately 4 mils. Thus the length of the window 118 is about 44 mils, which is the sum of the lengths of the plates 124, 126 and the gap 130. The window may have a width of about 38 mils. The epoxy ground sheet 120 may be a 2.5 mill epoxy sheet and the cutout section 134 may have a length of about 54 mils. Other lengths of the cutout section 134 may be used, but it advantageous that the cutout section 134 is longer than the window 118.

Embodiments of the present method and apparatus thus overcome the draw backs of the prior art by achieving matching by cutting out the ground plane under the capacitor. This provides the required matching and eliminates the need for any matching network on the substrate surface. The capacitor may be a DC blocking capacitor, and the microstrip line with the blocking capacitor may have a wide bandwidth in the range of 100 kilohertz to 60 gigahertz with minimized group delay. In one example, a typical group delay may range from 70 picoseconds to 75 picoseconds over a frequency bandwidth of approximately 100 kilohertz to 60 gigahertz. This results in a delta group delay of 5 picoseconds over the bandwidth. However, the delta group delay for embodiments according to the present apparatus is less than 2.0 picoseconds over the 60 gigahertz bandwidth. Furthermore, the return loss is improved from a typical −10 db to an improved −20 db according to embodiments of the present apparatus over the 60 gigahertz bandwidth.

Figure 10:
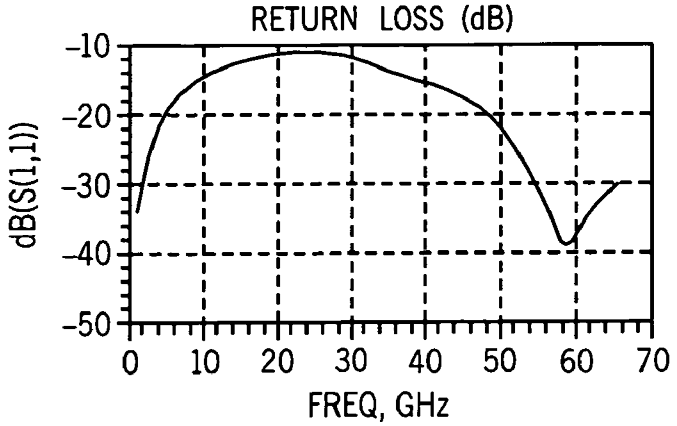
FIG. 10 PRIOR ART
FIGS. 10, 11 and 12 show typical return loss, typical insertion loss and typical group delay for known circuits over a wide bandwidth.
Figure 11:
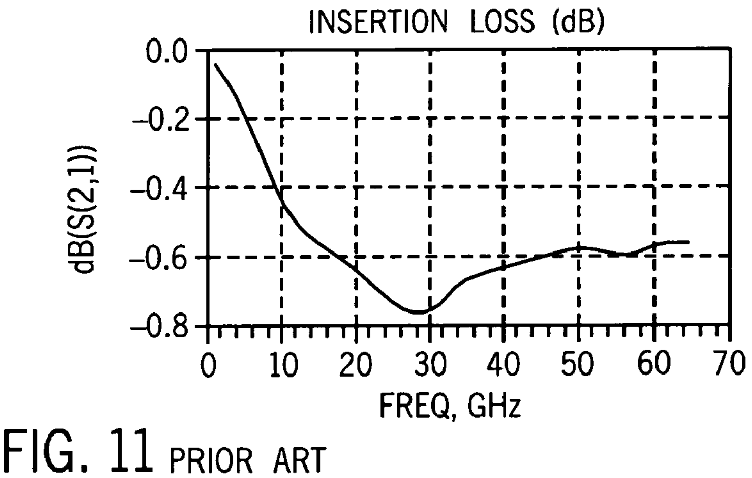
FIG. 11 PRIOR ART
Figure 12:
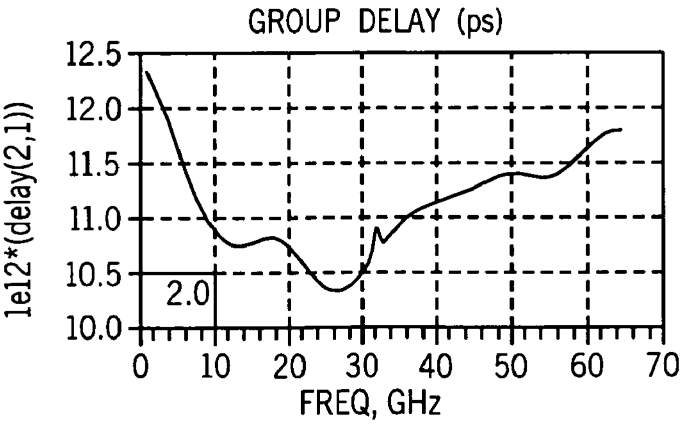
FIG. 12 PRIOR ART
Figure 13:
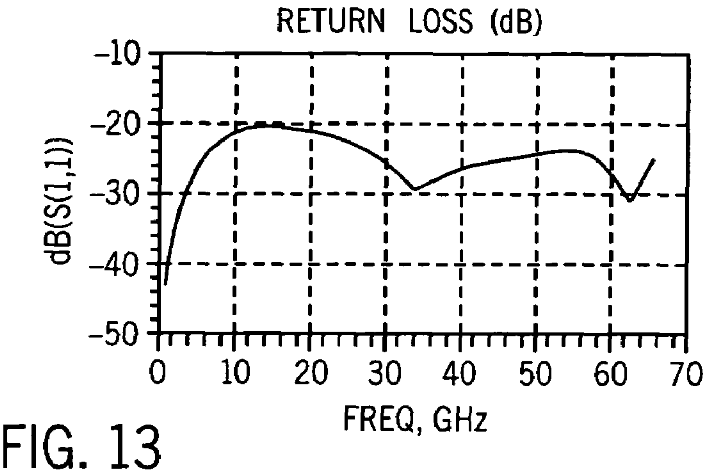
FIGS. 13, 14 and 15 show improved return loss, improved insertion loss and improved group delay for a DC blocking capacitor on a microstrip line according to embodiments of the present apparatus.
Figure 14:
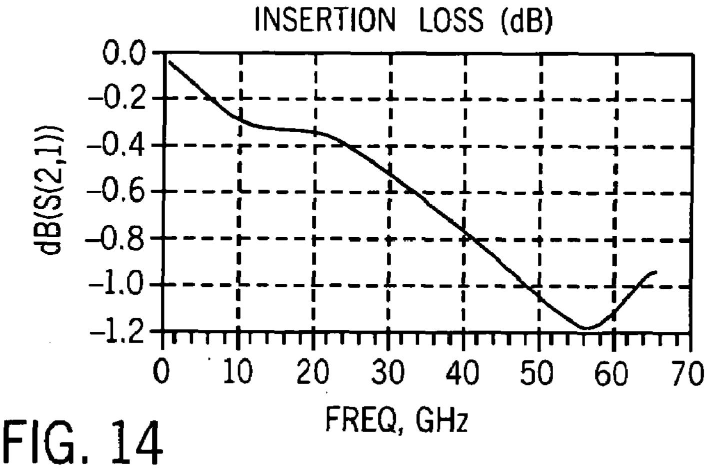
Figure 15:
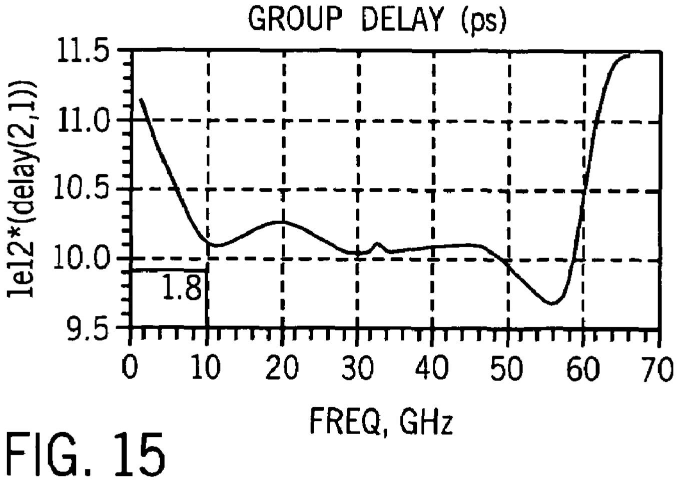

FIGS. 10, 11 and 12 shown typical return loss, typical insertion loss and typical group delay for known circuits over a wide bandwidth. This may be compared to the improvement depicted by FIGS. 13, 14 and 15 (improved return loss, improved insertion loss and improved group delay) for a DC blocking capacitor on a microstrip line according to embodiments of the present apparatus.

Figure 16:
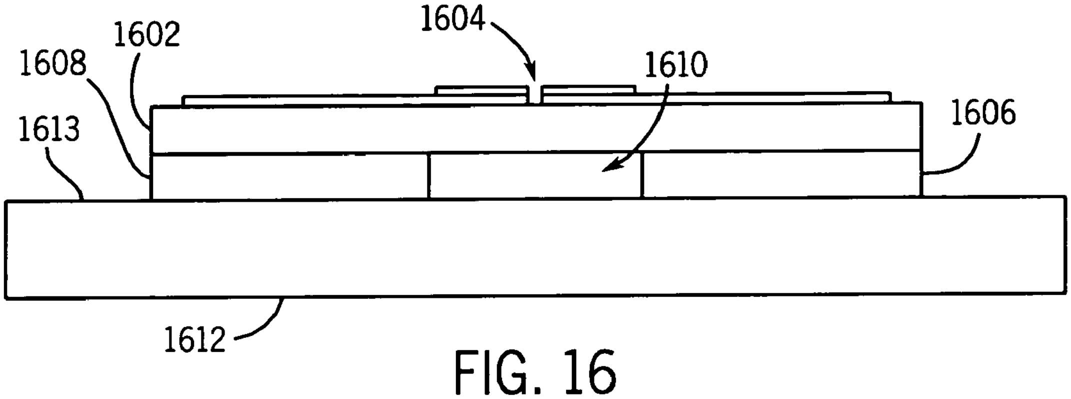
FIG. 16 depicts one embodiment of a microstrip line with a DC blocking capacitor and discontinuity matching network according to the present apparatus.

The embodiments thus far described are basically for a structure such as depicted in FIG. 16. In this embodiment a substrate 1602 has a DC blocking capacitor on an upper surface thereof. Ground sheets 1606 and 1608 are located on a lower surface of the substrate 1602 and define a window 1610 under the capacitor 1604. The window 1610 forms a space that reduces the capacitance between the plate area 128 and the top surface 1613 of the housing 1612 and achieves the improved performance. The ground sheets 1606 and 1608 are supported by a housing 1612.

Figure 17:
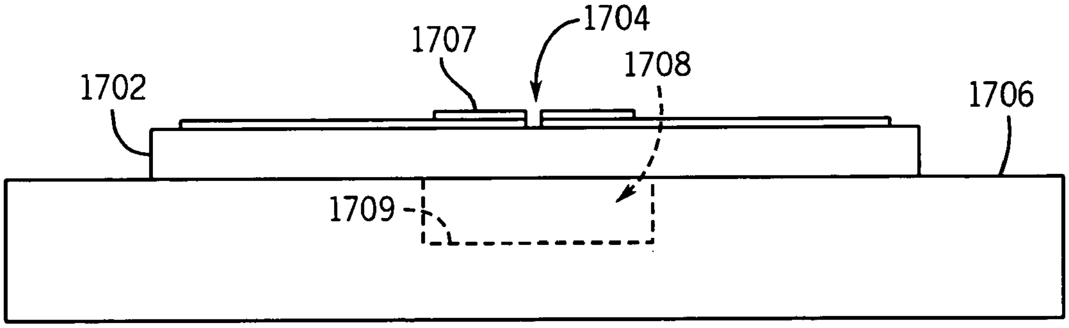
FIG. 17 depicts an alternative embodiment of a microstrip line with a DC blocking capacitor and discontinuity matching network according to the present apparatus.

An alternative embodiment of the present apparatus is depicted in FIG. 17. In this embodiment there are no ground sheets and the lower surface of the substrate 1702 is coupled directly to the housing 1706. The housing 1706 has a recess 1708 formed therein, the recess 1708 providing a space under the capacitor 1704 for reducing the capacitance between the plate area 1707 and the top surface 1709 of the recess of the housing 1612.

Although the embodiments of the present apparatus have been shown with square or rectangular shaped windows and recesses, it is to be understood that other shapes, such as round, oval and irregular shapes may be used. It is the area and depth of the window or recess relative to the plates of the capacitor which determines the reduction in capacitance and the improved performance.

Further embodiments of the present apparatus and method may combine the structures depicted in FIGS. 16 and 17. That is, such embodiments may have a recess in the housing and conductive epoxy sheets of finite thickness.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

We claim:

1. An apparatus comprising:

a substrate having a microstrip line;

a capacitor at a predetermined location along the microstrip line, the capacitor producing a discontinuity; and a ground plane assembly on the substrate, the ground plane assembly having an opening that compensates for the discontinuity of the capacitor;

wherein the ground plane assembly has a ground plane on the bottom surface of the substrate, the ground plane having a cutout area that forms a window in the ground plane, and wherein the ground plane assembly further has a ground sheet adjacent the bottom surface of the substrate, the ground sheet having a cutout section, and wherein the window in the ground plane is aligned substantially below the capacitor, and the cutout section of the ground sheet is aligned substantially below the window in the ground plane.

2. The apparatus according to claim 1, wherein the ground plane assembly is located substantially adjacent to the capacitor.

3. The apparatus according to claim 1, wherein the substrate has top and bottom surfaces, and wherein the microstrip line is located on the top surface of the substrate, and wherein the capacitor is at a predetermined location along the microstrip line, and wherein the ground plane assembly is located on the bottom surface of the substrate.

4. The apparatus according to claim 1, wherein the cutout area is longer than the window.

5. The apparatus according to claim 1, wherein the capacitor is a blocking capacitor, and wherein the microstrip line with the blocking capacitor has a wide bandwidth in the range of 100 kilohertz to 60 gigahertz with delta group delay of less than 2.0 picoseconds.

6. The apparatus according to claim 1, wherein the ground sheet is an epoxy sheet.

7. The apparatus according to claim 1, wherein the capacitor has first and second plates that define a capacitor plate area, and wherein the first and second plates of the capacitor are spaced apart by a predetermined distance.

8. The apparatus according to claim 7, wherein the first and second plates of the capacitor and the spaced apart distance thereof defines a capacitor length, and wherein the length of the window in the ground plane is substantially equal to the capacitor length.

9. The apparatus according to claim 8, wherein the cutout section of the ground sheet is longer than the length of the window in the ground plane.

10. An apparatus comprising:

a substrate having top and bottom surfaces;

a microstrip line on the top surface of the substrate;

a capacitor at a predetermined location along the microstrip line, the capacitor having first and second plates located substantially on the top surface of the substrate and that define a capacitor plate area;

a ground plane on the bottom surface of the substrate, the ground plane having a cutout area that forms a window in the ground plane;

a ground sheet adjacent the bottom surface of the substrate, the ground sheet having a cutout section; and the window in the ground plane being aligned substantially below the first and second plate area of the capacitor, and the cutout section of the ground sheet being aligned substantially below the window in the ground plane.

11. The apparatus according to claim 10, wherein the capacitor is a DC blocking capacitor.

12. The apparatus according to claim 10, wherein the ground sheet is an epoxy sheet.

13. The apparatus according to claim 10, wherein the first and second plates of the capacitor are spaced apart by a predetermined distance.

14. The apparatus according to claim 13, wherein the first and second plates of the capacitor and the spaced apart distance thereof defines a capacitor length, and wherein the length of the window in the ground plane is substantially equal to the capacitor length.

15. The apparatus according to claim 14, wherein the cutout section of the ground sheet is longer than the length of the window in the ground plane.

16. A method comprising:

forming a substrate having top and bottom surfaces;

forming a microstrip line on the top surface of the substrate;

forming a blocking capacitor at a predetermined location along the microstrip line, the blocking capacitor having first and second plates located substantially on the top surface of the substrate and that define a capacitor plate area;

forming a ground plane on the bottom surface of the substrate;

cutting out an area in the ground plane to form a window in the ground plane aligned substantially below the first and second plate area of the capacitor;

forming a ground sheet adjacent the bottom surface of the substrate; and cutting a section out of the ground sheet such that the cutout section is aligned substantially below the window in the ground plane.

17. The method according to claim 16, wherein the microstrip line with blocking capacitor has a wide bandwidth in the range of 100 kilohertz to 60 gigahertz with delta group delay of less than 2.0 picoseconds.

18. The method according to claim 16, wherein the first and second plates of the capacitor are spaced apart by a predetermined distance.

19. The method according to claim 18, wherein the first and second plates of the capacitor and the spaced apart distance thereof defines a capacitor length, and wherein the length of the window in the ground plane is substantially equal to the capacitor length.

20. The method according to claim 19, wherein the cutout section of the ground sheet is longer than the length of the window in the ground plane.

* * * * *